United States Patent
Shiragami

(10) Patent No.: US 11,398,585 B2
(45) Date of Patent: Jul. 26, 2022

(54) AIRTIGHT PACKAGE

(71) Applicant: Nippon Electric Glass Co., Ltd., Shiga (JP)

(72) Inventor: Toru Shiragami, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 24 days.

(21) Appl. No.: 17/269,001

(22) PCT Filed: Aug. 21, 2019

(86) PCT No.: PCT/JP2019/032658
§ 371 (c)(1),
(2) Date: Feb. 17, 2021

(87) PCT Pub. No.: WO2020/050031
PCT Pub. Date: Mar. 12, 2020

(65) Prior Publication Data
US 2021/0328109 A1    Oct. 21, 2021

(30) Foreign Application Priority Data

Sep. 6, 2018 (JP) .............................. JP2018-166669

(51) Int. Cl.
*H01L 33/48* (2010.01)
*H01L 31/0203* (2014.01)

(52) U.S. Cl.
CPC ........ *H01L 33/483* (2013.01); *H01L 31/0203* (2013.01)

(58) Field of Classification Search
CPC .......................... H01L 33/483; H01L 31/0203
See application file for complete search history.

(56) References Cited

U.S. PATENT DOCUMENTS

| | | | |
|---|---|---|---|
| 10,600,954 B2* | 3/2020 | Shiragami | C04B 37/045 |
| 11,043,616 B2* | 6/2021 | Shiragami | H01L 23/02 |
| 2012/0139133 A1* | 6/2012 | Takahashi | H01L 23/291 |
| | | | 257/E23.117 |
| 2013/0104980 A1* | 5/2013 | Sridharan | H01L 31/0203 |
| | | | 428/34 |

(Continued)

FOREIGN PATENT DOCUMENTS

| | | |
|---|---|---|
| JP | 2013-239609 | 11/2013 |
| JP | 2014-236202 | 12/2014 |

OTHER PUBLICATIONS

International Preliminary Report on Patentability and Written Opinion of the International Searching Authority dated Mar. 9, 2021 in International (PCT) Application No. PCT/JP2019/032658.

(Continued)

*Primary Examiner* — Eugene Lee
(74) *Attorney, Agent, or Firm* — Wenderoth, Lind & Ponack, L.L.P.

(57) ABSTRACT

The present invention provides a hermetic package, including a ceramic base and a glass cover hermetically integrated with each other via a sealing material layer, wherein the ceramic base includes 0.1 mass % to 10 mass % of a black pigment, and wherein a difference between: a light absorption rate of the ceramic base at a wavelength of 808 nm when converted to 0.5 mm; and a light absorption rate of the sealing material layer at a wavelength of 808 nm when converted to 0.005 mm is 30% or less.

20 Claims, 1 Drawing Sheet

(56) References Cited

U.S. PATENT DOCUMENTS

2013/0213852 A1* 8/2013 Yamazaki .............. B65D 85/00
                                                    206/701
2015/0380330 A1* 12/2015 Mitsui ..................... H01L 23/04
                                                    257/680
2016/0276544 A1* 9/2016 Shiratori ................... C03C 8/24
2018/0040777 A1* 2/2018 Matsui .................. H01L 33/483

OTHER PUBLICATIONS

International Search Report dated Oct. 29, 2019 in International (PCT) Application No. PCT/JP2019/032658.

* cited by examiner

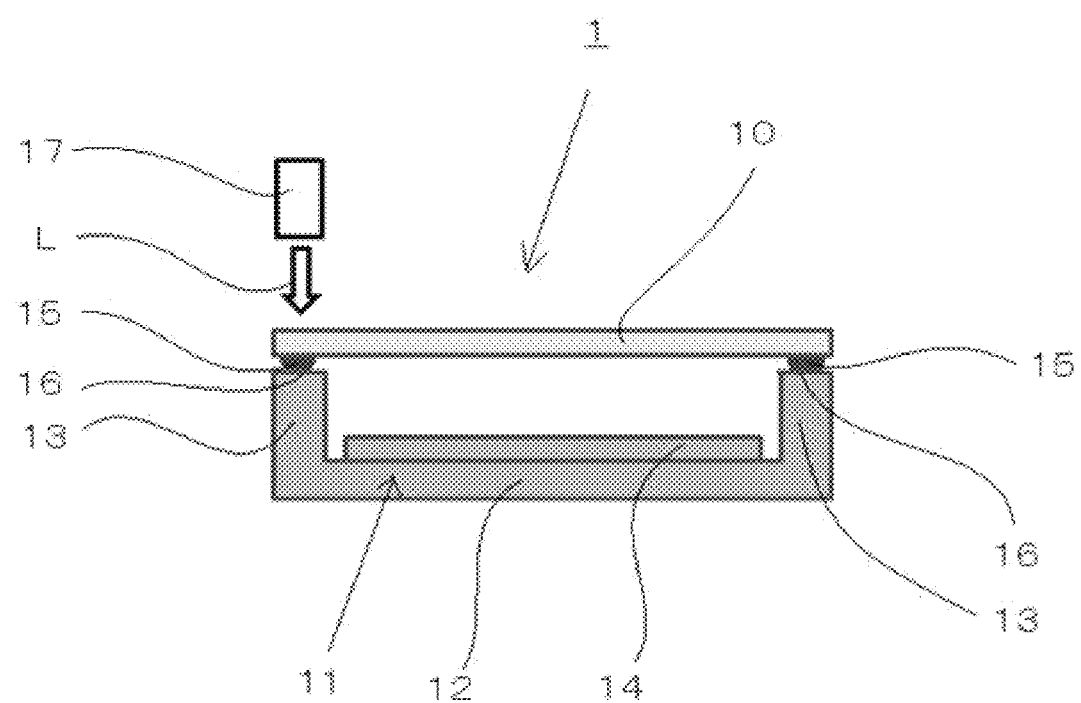

AIRTIGHT PACKAGE

TECHNICAL FIELD

The present invention relates to a hermetic package, and more particularly, to a hermetic package capable of housing an internal device, such as an LED or a sensor chip.

BACKGROUND ART

In general, a hermetic package includes: a glass cover having light transmissivity; a ceramic base including a base part and a frame part formed on the base part; and an internal device housed in an internal space surrounded by these components.

There is a risk in that the internal device to be mounted in the hermetic package, such as a sensor, or a member on the periphery thereof deteriorates owing to moisture penetrating from a surrounding environment.

An organic resin-based adhesive having low-temperature curability or UV curability has hitherto been used for integrating the ceramic base and the glass cover with each other. However, the organic resin-based adhesive hardly completely blocks moisture or a gas, and hence there is a risk in that the internal device deteriorates with time.

Meanwhile, when composite powder including glass powder is used as a sealing material, the internal device is less liable to deteriorate owing to moisture of a surrounding environment.

However, the glass powder has a higher softening temperature than the organic resin-based adhesive, and hence there is a risk in that the internal device is thermally degraded at the time of sealing.

Under such circumstances, laser sealing has attracted attention. In the laser sealing, a sealing material layer is generally irradiated with laser light having a wavelength in the near-infrared region to soften and deform, to thereby hermetically integrate the ceramic base and the glass cover with each other. Moreover, in the laser sealing, only a portion to be sealed can be locally heated, and hence the ceramic base and the glass cover can be hermetically integrated with each other without thermal degradation of the internal device.

CITATION LIST

Patent Literature 1: JP 2013-239609 A
Patent Literature 2: JP 2014-236202 A

SUMMARY OF INVENTION

Technical Problem

Incidentally, in the laser sealing of the ceramic base and the glass cover, the ceramic base has a difficulty in being increased in temperature at the time of laser sealing because of having high thermal conductivity, and hence it is difficult to allow the ceramic base and the sealing material layer to react with each other, resulting in a problem in that it is difficult to ensure laser sealing strength.

Meanwhile, reactivity between the sealing material layer and the ceramic base can be increased by increasing an output of the laser light or by reducing a scanning speed of the laser light. In this case, however, a large temperature difference occurs between a region having been locally heated and a region not having been locally heated in the glass cover, and hence the glass cover is liable to be broken due to thermal shock, resulting in a problem in that hermetic reliability in the hermetic package cannot be ensured.

In light of the foregoing, the present invention has been made in view of the above-mentioned circumstances, and a technical object of the present invention is to provide a hermetic package having high hermetic reliability and high sealing strength.

Solution to Problem

The inventor of the present invention has repeated various experiments, and as a result, has found that the above-mentioned technical object can be achieved by reducing a difference in laser absorption characteristics between a ceramic base and a sealing material layer. Thus, the finding is proposed as the present invention. That is, according to one embodiment of the present invention, there is provided a hermetic package, comprising a ceramic base and a glass cover hermetically integrated with each other via a sealing material layer, wherein the ceramic base comprises 0.1 mass % to 10 mass % of a laser absorber, and wherein a difference between a light absorption rate of the ceramic base at a wavelength of 808 nm when converted to 0.5 mm and a light absorption rate of the sealing material layer at a wavelength of 808 nm when converted to 0.005 mm is 30% or less. Herein, the "light absorption rate when converted to 0.5 mm" refers to a light absorption rate when a measurement optical path length is set to 0.5 mm. For example, even when the thickness of the ceramic base is 1.0 mm, the light absorption rate is determined by converting the measurement optical path length to 0.5 mm. In addition, the "light absorption rate when converted to 0.005 mm" refers to a light absorption rate when a measurement optical path length is set to 0.005 mm. For example, even when the thickness of the sealing material layer is 0.01 mm, the light absorption rate is determined by converting the measurement optical path length to 0.005 mm.

The light absorption rate is calculated from the following equation 1 by determining a total light transmittance and a total light reflectance in a predetermined wavelength region.

$$\text{Light absorption rate (\%)} = \{100-(\text{total light transmittance}+\text{total light reflectance})\}(\%) \quad \text{Equation 1}$$

In addition, in the hermetic package according to the embodiment of the present invention, it is preferred that a total light reflectance of the ceramic base at a wavelength of 808 nm when converted to 0.5 mm be 60% or less. Herein, the "total light reflectance when converted to 0.5 mm" refers to a total light reflectance when a measurement optical path length is set to 0.5 mm. For example, even when the thickness of the ceramic base is 1.0 mm, the total light reflectance is determined by converting the measurement optical path length to 0.5 mm.

In addition, in the hermetic package according to the embodiment of the present invention, it is preferred that the laser absorber in the ceramic base be formed of at least one selected from the group consisting of an Fe-based oxide, a Cr-based oxide, a Mn-based oxide, a Cu-based oxide, and spinel-type composite oxides thereof.

In addition, in the hermetic package according to the embodiment of the present invention, it is preferred that the ceramic base be formed of any one of glass ceramic, aluminum oxide, and aluminum nitride, or a composite material thereof.

In addition, in the hermetic package according to the embodiment of the present invention, it is preferred that the ceramic base comprise a base part and a frame part formed on the base part, and the sealing material layer be provided between a top of the frame part and the glass cover.

In addition, in the hermetic package according to the embodiment of the present invention, it is preferred that the sealing material layer comprise: bismuth-based glass containing a transition metal oxide in a glass composition; and a refractory filler, and be substantially free of a laser absorber.

In addition, in the hermetic package according to the embodiment of the present invention, it is preferred that the ceramic base have an internal device housed within a frame part.

An embodiment of the present invention is hereinafter described with reference to the drawing. FIG. 1 is a schematic sectional view of a hermetic package of the present invention. A hermetic package 1 comprises a glass cover 10 and a ceramic base 11. The ceramic base 11 comprises a base part 12, and further comprises a frame part 13 on an outer peripheral edge portion of the base part 12. In addition, an internal device 14 is housed within the frame part 13 of the ceramic base 11. Electrical wiring (not shown) configured to electrically connect the internal device 14 to an outside is formed in the ceramic base 11.

A sealing material layer 15 is formed in a frame shape on a surface of the glass cover 10. The width of the sealing material layer 15 is smaller than the width of a top 16 of the frame part 13 of the ceramic base 11.

The glass cover 10 and the ceramic base 11 are arranged so as to be laminated on each other so that the sealing material layer 15 of the glass cover 10 corresponds to a center line in a width direction of the top 16 of the frame part 13 of the ceramic base 11. After that, laser light L emitted from a laser irradiation apparatus 17 is radiated along the sealing material layer 15 from a glass cover 10 side. With this configuration, the sealing material layer 15 softens and flows, and then the glass cover 10 and the ceramic base 11 are hermetically sealed with each other. Thus, a hermetic structure of the hermetic package 1 is formed.

BRIEF DESCRIPTION OF DRAWINGS

FIG. 1 is a schematic sectional view for illustrating a hermetic package according to an embodiment of the present invention.

DESCRIPTION OF EMBODIMENTS

A hermetic package of the present invention comprises a ceramic base, and it is preferred that the ceramic base comprise a base part and a frame part formed on the base part. With this configuration, an internal device, such as a sensor chip or an LED, is easily housed within the frame part. The frame part of the ceramic base is preferably formed in a frame shape along an outer peripheral edge portion of the ceramic base. With this configuration, an effective area for functioning as a device can be enlarged. Further, the internal device, such as a sensor chip or an LED, is easily housed within the frame part of the ceramic base. Besides, for example, joining of wiring is easily performed.

The ceramic base comprises a laser absorber at a ratio of from 0.1 mass % to 10 mass %, preferably at a ratio of from 0.2 mass % to 5 mass %. With this configuration, at the time of laser sealing, the ceramic base can absorb laser light transmitted through a sealing material layer. As a result, the temperature of an interface between the sealing material layer and the ceramic base is increased, and the reactivity between the ceramic base and the sealing material layer is increased. Besides, a heat flow toward a ceramic base side is reduced. Thus, the laser sealing can be performed efficiently.

From the viewpoint of laser absorption characteristics, the laser absorber is formed of at least one selected from the group consisting of an Fe-based oxide, a Cr-based oxide, a Mn-based oxide, a Cu-based oxide, and spinel-type composite oxides thereof.

The ceramic base is preferably formed of anyone of glass ceramic, aluminum oxide, and aluminum nitride, or a composite material thereof (e.g., a composite material in which aluminum nitride and glass ceramic are integrated with each other). Glass ceramic facilitates formation of a thermal via, and hence, at the time of operation of the internal device, a situation in which the hermetic package generates excessive heat can be properly prevented. Aluminum nitride and aluminum oxide each have a satisfactory heat dissipating property, and hence, at the time of operation of the internal device, a situation in which the hermetic package generates excessive heat can be properly prevented.

The light absorption rate of the ceramic base at a wavelength of 808 nm when converted to 0.5 mm is preferably from 55% to 95% or from 60% to 90%, particularly preferably from 65% to 80%. When the light absorption rate of the ceramic base at a wavelength of 808 nm when converted to 0.5 mm is too low, at the time of laser sealing, the ceramic base hardly absorbs laser light transmitted through the sealing material layer. Meanwhile, when the light absorption rate of the ceramic base at a wavelength of 808 nm when converted to 0.5 mm is too high, the content of the laser absorber becomes excessive, with the result that a heat dissipating property of the ceramic base is liable to be reduced, and the production cost of the ceramic base is liable to be increased.

A difference between the light absorption rate of the ceramic base at a wavelength of 808 nm when converted to 0.5 mm and the light absorption rate of the sealing material layer at a wavelength of 808 nm when converted to 0.005 mm is 30% or less, preferably 25% or less, 20% or less, 15% or less, or 10% or less, particularly preferably 5% or less. When the difference between the light absorption rate of the ceramic base at a wavelength of 808 nm when converted to 0.5 mm and the light absorption rate of the sealing material layer at a wavelength of 808 nm when converted to 0.005 mm is too large, the laser light is excessively absorbed by the sealing material layer at the time of laser sealing, and the temperature of the ceramic base is hardly increased. As a result, the ceramic base and the sealing material layer do not sufficiently react with each other, and it becomes difficult to ensure laser sealing strength. Alternatively, the laser light is less absorbed by the sealing material layer at the time of laser sealing, and the sealing material layer hardly softens and flows. As a result, it becomes difficult to ensure laser sealing strength.

The total light reflectance of the ceramic base at a wavelength of 808 nm when converted to 0.5 mm is preferably 60% or less, 55% or less, particularly preferably 50% or less. When the total light reflectance of the ceramic base at a wavelength of 808 nm when converted to 0.5 mm is too high, at the time of laser sealing, the ceramic base hardly absorbs laser light transmitted through the sealing material layer.

The thickness of the base part of the ceramic base is preferably from 0.1 mm to 5.0 mm, particularly preferably from 0.2 mm to 1.5 mm. With this configuration, thinning of the hermetic package can be achieved.

The thickness of the frame part of the ceramic base is preferably from 0.2 mm to 5.0 mm, particularly preferably from 0.5 mm to 2.0 mm. With this configuration, thinning of the hermetic package can be easily achieved. Further, the internal device, such as a sensor chip or an LED, is easily housed, and for example, joining of wiring can be easily performed.

The width of the frame part of the ceramic base is preferably from 0.3 mm to 5.0 mm, particularly preferably from 0.5 mm to 4.0 mm. With this configuration, the internal device is easily housed, and downsizing of the hermetic package is easily achieved.

The hermetic package of the present invention comprises a glass cover. Various glasses may be used for the glass cover. For example, alkali-free glass, borosilicate glass, or soda lime glass may be used.

The sheet thickness of the glass cover is preferably from 0.01 mm to 2.0 mm or from 0.1 mm to 1.2 mm, particularly preferably from 0.3 mm to 1.0 mm. With this configuration, thinning of the hermetic package can be achieved.

A functional film may be formed on a surface of the glass cover on an internal device side, or on a surface of the glass cover on an outside. An antireflection film is particularly preferred as the functional film. With this configuration, light reflected on the surface of the glass cover can be reduced.

The glass cover may be formed of a glass sheet laminate in which a first glass sheet and a second glass sheet are laminated on and integrated with each other via an adhesive. Various glasses may be used for each of the first glass sheet and the second glass sheet. For example, alkali-free glass, alkali borosilicate glass, or soda lime glass may be used. The glass sheet laminate is preferably formed of two glass sheets, but as required, another sheet-shaped body may be further laminated.

The same glass may be used for the first glass sheet and the second glass sheet. That is, the first glass sheet and the second glass sheet may have the same glass composition. With this configuration, various characteristics of both glass sheets, such as refractive indices and thermal expansion coefficients, match each other, and hence warpage of the glass cover, reflection on a bonded surface, and the like can be suppressed.

In addition, different kinds of glasses may be used for the first glass sheet and the second glass sheet. That is, the first glass sheet and the second glass sheet may have different kinds of glass compositions. With this configuration, the thermal expansion coefficient of the second glass sheet is not restricted by the thermal expansion coefficient of the ceramic base. Accordingly, while the thermal expansion coefficients of the ceramic base and the first glass sheet are allowed to strictly match each other, an inexpensive glass sheet can be used as the second glass sheet. As a result, both the hermetic reliability and the production cost of the hermetic package are easily achieved.

The hermetic package of the present invention comprises the sealing material layer. The sealing material layer is produced through application, drying, binder removal, and sintering of a sealing material paste produced by kneading a sealing material and a vehicle. The sealing material is generally composite powder containing glass powder and refractory filler powder, and as required, a laser absorber, such as a color pigment, is added thereto in some cases. Moreover, the sealing material is a material which softens and flows at the time of laser sealing to hermetically integrate the ceramic base and the glass cover with each other. The vehicle generally refers to a mixture of an organic resin and a solvent, that is, a viscos liquid in which an organic resin is dissolved. The sealing material paste is obtained by dispersing the sealing material in the vehicle. As required, a surfactant, a thickener, or the like is added to the vehicle in some cases.

Composite powder containing glass powder and refractory filler powder is preferably used as the sealing material. As the composite powder, composite powder containing 60 vol % to 100 vol % of glass powder and 0 vol % to 40 vol % of refractory filler powder is preferably used, and composite powder containing 65 vol % to 95 vol % of bismuth-based glass powder and 5 vol % to 35 vol % of refractory filler powder is more preferably used. The refractory filler powder is added in order to facilitate the matching of the thermal expansion coefficients of the ceramic base and the glass cover. As a result, a situation in which an improper stress remains in the sealed sites after the laser sealing, resulting in breakage, can be prevented. Meanwhile, when the content of the refractory filler powder is too large, the content of the glass powder is relatively reduced, and hence the surface smoothness of the sealing material layer is reduced, and the adhesiveness between the top of the frame part of the ceramic base and the sealing material layer is reduced. As a result, the laser sealing strength is liable to be reduced.

The softening point of the sealing material is preferably 530° C. or less or 510° C. or less, particularly preferably 480° C. or less. When the softening point of the sealing material is too high, it becomes difficult to increase the surface smoothness of the sealing material layer. Further, it is required to excessively increase the temperature at the time of laser sealing, and the glass cover is liable to be broken. The lower limit of the softening point of the sealing material is not particularly set, but in consideration of the thermal stability of the glass powder, the softening point of the sealing material is preferably 350° C. or more. Herein, the "softening point" refers to the fourth inflection point measured with a macro-type DTA apparatus.

The glass powder is preferably formed of bismuth-based glass from the viewpoint of increasing the laser sealing strength. The bismuth-based glass preferably comprises as a glass composition, in terms of mol %, 28% to 60% of $Bi_2O_3$, 15% to 37% of $B_2O_3$, 0% to 30% of ZnO, and 1% to 40% of CuO+MnO (total amount of CuO and MnO). The reasons why the content range of each component is limited as described above are described below. In the description of the glass composition range, the expression "%" means "mold %".

$Bi_2O_3$ is a main component for reducing a softening point. The content of $Bi_2O_3$ is preferably from 28% to 60% or from 33% to 55%, particularly preferably from 35% to 45%. When the content of $Bi_2O_3$ is too small, the softening point becomes too high, and softening flowability is liable to be reduced. Meanwhile, when the content of $Bi_2O_3$ is too large, the glass is liable to devitrify at the time of laser sealing, and owing to the devitrification, the softening flowability is liable to be reduced.

$B_2O_3$ is an essential component as a glass-forming component. The content of $B_2O_3$ is preferably from 15% to 37% or from 19% to 33%, particularly preferably from 22% to 30%. When the content of $B_2O_3$ is too small, a glass network is hardly formed, and hence the glass is liable to devitrify at the time of laser sealing. Meanwhile, when the content of $B_2O_3$ is too large, the glass has increased viscosity, and hence the softening flowability is liable to be reduced.

ZnO is a component which improves devitrification resistance. The content of ZnO is preferably from 0% to 30%, from 3% to 25%, or from 5% to 22%, particularly preferably from 5% to 20%. When the content of ZnO is too large, the glass composition loses its component balance, and hence the devitrification resistance is liable to be reduced contrarily.

CuO and MnO are each a component which significantly improves a laser absorption ability. The total content of CuO and MnO is preferably from 1% to 40%, from 3% to 35%, or from 10% to 30%, particularly preferably from 15% to 30%. When the total content of CuO and MnO is too small, the laser absorption ability is liable to be reduced. Meanwhile, when the total content of CuO and MnO is too large, the softening point is excessively increased, and the glass hardly softens and flows even when irradiated with laser light. In addition, the glass becomes thermally unstable, and the glass is liable to devitrify at the time of laser sealing. The content of CuO is preferably from 1% to 30%, particularly preferably from 10% to 25%. The content of MnO is preferably from 0% to 25% or from 1% to 25%, particularly preferably from 3% to 15%.

In addition to the above-mentioned components, for example, the following components may be added.

$SiO_2$ is a component which improves water resistance. The content of $SiO_2$ is preferably from 0% to 5%, from 0% to 3%, or from 0% to 2%, particularly preferably from 0% to 1%. When the content of $SiO_2$ is too large, there is a risk in that the softening point is improperly increased. In addition, the glass is liable to devitrify at the time of laser sealing.

$Al_2O_3$ is a component which improves the water resistance. The content of $Al_2O_3$ is preferably from 0% to 10% or from 0.1% to 5%, particularly preferably from 0.5% to 3%. When the content of $Al_2O_3$ is too large, there is a risk in that the softening point is improperly increased.

$Li_2O$, $Na_2O$, and $K_2O$ are each a component which reduces the devitrification resistance. Accordingly, the content of each of $Li_2O$, $Na_2O$, and $K_2O$ is preferably from 0% to 5% or from 0% to 3%, particularly preferably from 0% to less than 1%.

MgO, CaO, SrO, and BaO are each a component which improves the devitrification resistance, but are each a component which increases the softening point. Accordingly, the content of each of MgO, CaO, SrO, and BaO is preferably from 0% to 20% or from 0% to 10%, particularly preferably from 0% to 5%.

$Fe_2O_3$ is a component which improves the devitrification resistance and the laser absorption ability. The content of $Fe_2O_3$ is preferably from 0% to 10% or from 0.1% to 5%, particularly preferably from 0.4% to 2%. When the content of $Fe_2O_3$ is too large, the glass composition loses its component balance, and hence the devitrification resistance is liable to be reduced contrarily.

$Sb_2O_3$ is a component which improves the devitrification resistance. The content of $Sb_2O_3$ is preferably from 0% to 5%, particularly preferably from 0% to 2%. When the content of $Sb_2O_3$ is too large, the glass composition loses its component balance, and hence the devitrification resistance is liable to be reduced contrarily.

In addition, not only the bismuth-based glass, but also any one of silver phosphoric acid-based glass and tellurium-based glass may be used as the sealing material. The silver phosphoric acid-based glass and the tellurium-based glass each have the following feature: as compared to the bismuth-based glass, the silver phosphoric acid-based glass and the tellurium-based glass each soften and flow at low temperature easily, and can reduce heat strain occurring after the laser sealing, and thus can improve thermal reliability and mechanical reliability. Further, when mixed with the refractory filler powder, the silver phosphoric acid-based glass and the tellurium-based glass each can increase the mechanical strength of the sealing material layer, and can reduce the thermal expansion coefficient of the sealing material layer, as with the bismuth-based glass.

The silver phosphoric acid-based glass preferably comprises as a glass composition, in terms of mol %, 10% to 50% of $Ag_2O$, 10% to 35% of $P_2O_5$, 3% to 25% of ZnO, and 0% to 30% of a transition metal oxide. In the description of the glass composition range of the silver phosphoric acid-based glass, the expression "%" means "mol %".

$Ag_2O$ is a component which reduces the melting point of the glass, and is also a component which improves water resistance because $Ag_2O$ is less soluble in water. The content of $Ag_2O$ is preferably from 10% to 50%, particularly preferably from 20% to 40%. When the content of $Ag_2O$ is too small, the viscosity of the glass is increased, and flowability is liable to be reduced. Besides, the water resistance is liable to be reduced. Meanwhile, when the content of $Ag_2O$ is too large, vitrification becomes difficult.

$P_2O_5$ is a component which reduces the melting point of the glass. The content thereof is preferably from 10% to 35%, particularly preferably from 15% to 25%. When the content of $P_2O_5$ is too small, vitrification becomes difficult. Meanwhile, when the content of $P_2O_5$ is too large, weather resistance and the water resistance are liable to be reduced.

ZnO is a component which improves the devitrification resistance, and the content thereof is preferably from 3% to 25% or from 5% to 22%, particularly preferably from 9% to 20%. When the content of ZnO is outside the above-mentioned ranges, the glass composition loses its component balance, and hence the devitrification resistance is liable to be reduced.

The transition metal oxide is a component which has laser absorption characteristics, and the content thereof is preferably from 0% to 30% or from 1% to 30%, particularly preferably from 3% to 15%. When the content of the transition metal oxide is too large, the devitrification resistance is liable to be reduced.

When CuO is added, the laser absorption characteristics can be improved. The content of CuO is preferably from 0% to 30% or from 1% to 30%, particularly preferably from 3% to 15%. When the content of CuO is too large, the glass composition loses its component balance, and hence the devitrification resistance is liable to be reduced contrarily.

In addition to the above-mentioned components, for example, the following components may be added.

$TeO_2$ is a glass-forming component, and is also a component which reduces the melting point of the glass. The content of $TeO_2$ is preferably from 0% to 40%, particularly preferably from 10% to 30%.

$Nb_2O_5$ is a component which improves the water resistance. The content of $Nb_2O_5$ is preferably from 0% to 25%, particularly preferably from 1% to 12%. when the content of $Nb_2O_5$ is too large, the viscosity of the glass is increased, and the flowability is liable to be reduced.

$Li_2O$, $Na_2O$, and $K_2O$ are each a component which reduces the devitrification resistance. Accordingly, the contents of $Li_2O$, $Na_2O$, and $K_2O$ are each from 0% to 5% or from 0% to 3%, particularly from 0% to less than 1%.

MgO, CaO, SrO, and BaO are each a component which improves the devitrification resistance, but are each also a component which increases the softening point. Accordingly, the contents of MgO, CaO, SrO, and BaO are each from 0% to 20% or from 0% to 10%, particularly from 0% to 5%.

The tellurium-based glass preferably comprises as a glass composition, in terms of mol %, 20% to 80% of $TeO_2$, 0% to 25% of $Nb_2O_5$, and 0% to 40% of a transition metal oxide. In the description of the glass composition range of the tellurium-based glass, the expression "%" means "mold".

$TeO_2$ is a glass-forming component, and is also a component which reduces the melting point of the glass. The content of $TeO_2$ is preferably from 20% to 80%, particularly preferably from 40% to 75%.

$Nb_2O_5$ is a component which improves the water resistance. The content of $Nb_2O_5$ is preferably from 0% to 25% or from 1% to 20%, particularly preferably from 5% to 15%. When the content of $Nb_2O_5$ is too large, the viscosity of the glass is increased, and the flowability is liable to be reduced.

The transition metal oxide is a component which has laser absorption characteristics, and the content thereof is preferably from 0% to 40% or from 5% to 30%, particularly preferably from 15% to 25%. When the content of the transition metal oxide is too large, the devitrification resistance is liable to be reduced.

Of the transition metal oxides, CuO has a high improving effect on the laser absorption characteristics, and also has a high improving effect on thermal stability. The content of CuO is preferably from 0% to 40% or from 5% to 30%, particularly preferably from 15% to 25%. When the content of CuO is too large, the glass composition loses its component balance, and hence the devitrification resistance is liable to be reduced contrarily.

In addition to the above-mentioned components, for example, the following components may be added.

$Li_2O$, $Na_2O$, and $K_2O$ are each a component which reduces the devitrification resistance. Accordingly, the contents of $Li_2O$, $Na_2O$, and $K_2O$ are each from 0% to 5% or from 0% to 3%, particularly from 0% to less than 1%.

MgO, CaO, SrO, and BaO are each a component which improves the devitrification resistance, but are each also a component which increases the softening point. Accordingly, the contents of MgO, CaO, SrO, and BaO are each from 0% to 20% or from 0% to 10%, particularly from 0% to 5%.

The average particle diameter $D_{50}$ of the glass powder is preferably less than 15 µm or from 0.5 µm to 10 µm, particularly preferably from 1 µm to 5 µm. As the average particle diameter $D_{50}$ of the glass powder becomes smaller, the softening point of the glass powder is reduced more. Herein, the "average particle diameter $D_{50}$" refers to a value measured by laser diffractometry on a volume basis.

The refractory filler powder is preferably one kind or two or more kinds selected from cordierite, zircon, tin oxide, niobium oxide, zirconium phosphate-based ceramic, will emite, β-eucryptite, and β-quartz solid solution, particularly preferably β-eucryptite or cordierite. Those refractory filler powders each have a low thermal expansion coefficient and a high mechanical strength, and besides are each well compatible with, for example, the bismuth-based glass, the silver phosphoric acid-based glass, and the tellurium-based glass.

The average particle diameter $D_{50}$ of the refractory filler powder is preferably less than 2 µm, particularly preferably 0.1 µm or more and less than 1.5 µm. When the average particle diameter $D_{50}$ of the refractory filler powder is too large, the surface smoothness of the sealing material layer is liable to be reduced. Besides, the average thickness of the sealing material layer is liable to be increased, with the result that the accuracy of the laser sealing is liable to be reduced.

The 99% particle diameter $D_{99}$ of the refractory filler powder is preferably less than 5 µm or 4 µm or less, particularly preferably 0.3 µm or more and 3 µm or less. When the 99% particle diameter $D_{99}$ of the refractory filler powder is too large, the surface smoothness of the sealing material layer is liable to be reduced. Besides, the average thickness of the sealing material layer is liable to be increased, with the result that the accuracy of the laser sealing is liable to be reduced. Herein, the "99% particle diameter $D_{99}$" refers to a value measured by laser diffractometry on a volume basis.

The sealing material may further comprise a laser absorber in order to improve laser absorption characteristics. However, the laser absorber has an action of accelerating the devitrification of the glass. Further, when the laser absorber is introduced, the laser absorption characteristics of the sealing material are excessively increased, and a difference in laser absorption characteristics between the ceramic base and the sealing material layer is liable to be increased. Accordingly, the content of the laser absorber in the sealing material layer is preferably 10 vol % or less, 5 vol % or less, 1 vol % or less, or 0.5 vol % or less. It is particularly preferred that the sealing material layer be substantially free of the laser absorber. As the laser absorber, for example, a Cu-based oxide, an Fe-based oxide, a Cr-based oxide, a Mn-based oxide, or a spinel-type composite oxide thereof may be used.

The thermal expansion coefficient of the sealing material is preferably from $55\times10^{-7}/°C$. to $110\times10^{-7}/°C$. or from $60\times10^{-7}/°C$. to $100\times10^{-7}/°C$., particularly preferably from $65\times10^{-7}/°C$. to $90\times10^{-7}/°C$. With this configuration, the thermal expansion coefficient of the sealing material matches the thermal expansion coefficient of the glass cover or the ceramic base, with the result that a stress remaining in the sealed sites is reduced. The "thermal expansion coefficient" refers to a value measured with a push-rod type thermal expansion coefficient measurement (TMA) apparatus in a temperature range of from 30° C. to 200° C.

The sealing material paste is generally produced by kneading the sealing material and the vehicle with a triple roller or the like to disperse the sealing material in the vehicle. As describe above, the vehicle contains an organic resin and a solvent. The organic resin is added for the purpose of adjusting the viscosity of the paste.

As the organic resin to be added to the vehicle, there may be used an acrylic acid ester (acrylic organic resin), ethylcellulose, a polyethylene glycol derivative, nitrocellulose, polymethylstyrene, polyethylene carbonate, polypropylene carbonate, a methacrylic acid ester, and the like. As the solvent to be used in the vehicle, there may be used N,N'-dimethylformamide (DMF), α-terpineol, a higher alcohol, γ-butyrolactone (γ-BL), tetralin, a terpene, butylcarbitol acetate, ethyl acetate, isoamyl acetate, diethylene glycol monoethyl ether, diethylene glycol monoethyl ether acetate, benzyl alcohol, toluene, 3-methoxy-3-methylbutanol, triethylene glycol monomethyl ether, triethylene glycol dimethyl ether, dipropylene glycol monomethyl ether, dipropylene glycol monobutyl ether, tripropylene glycol monomethyl ether, tripropylene glycol monobutyl ether, propylene carbonate, dimethyl sulfoxide (DMSO), N-methyl-2-pyrrolidone, and the like.

The application of the sealing material paste onto the glass cover may be performed by a well-known method. For example, screen printing, dispenser application, and the like may be adopted. The drying of an application film may be performed by natural cooling, but from the viewpoint of drying efficiency, is preferably performed using an electric furnace or a drying furnace.

When binder removal treatment is performed on a dried film through overall heating of an electric furnace or the like, and heating is performed thereon at a temperature equal to or higher than the softening point of the glass powder to allow the sealing material layer to soften and flow, a sealing material layer having high surface smoothness can be obtained.

Sintering treatment may also be performed on the dried film through irradiation with laser light. At this time, it is preferred to form the sealing material layer by irradiating the dried film with laser light, and then subject the glass cover to heat treatment at a temperature equal to or higher than 100° C. and equal to or lower than the strain point of the glass cover. With this configuration, thermal shock of the glass cover is suppressed, and hence the breakage of the glass cover is easily prevented.

The light absorption rate of the sealing material layer at a wavelength of 808 nm when converted to 0.005 mm is preferably 50% or more, 65% or more, or from 70% to 95%, particularly preferably from 75% to 85%. When the light absorption rate of the sealing material layer at a wavelength of 808 nm when converted to 0.005 mm is too low, the sealing material layer hardly adsorbs the laser light, and hardly softens and flows at the time of laser sealing. Meanwhile, when the light absorption rate of the sealing material layer at a wavelength of 808 nm when converted to 0.005 mm is too high, it becomes difficult to locally heat the ceramic base at the time of laser sealing, and hence a reaction between the ceramic base and the sealing material layer does not sufficiently proceed. As a result, the laser sealing strength is liable to be reduced.

The average thickness of the sealing material layer is preferably less than 10.0 μm, particularly preferably 1.0 μm or more and less than 7.0 μm. As the average thickness of the sealing material layer becomes smaller, a stress remaining in the sealed sites after the laser sealing can be reduced more even when the thermal expansion coefficients of the sealing material layer, the ceramic base, and the glass cover mismatch each other. In addition, accuracy of the laser sealing can also be improved. As a method of controlling the average thickness of the sealing material layer as describe above, there are given: a method involving thinly applying the sealing material paste; and a method involving subjecting the surface of the sealing material layer to polishing treatment.

The average width of the sealing material layer is preferably less than 3,500 μm or less than 1,200 μm, particularly preferably 150 μm or more and less than 800 μm. When the average width of the sealing material layer is narrowed, a stress remaining in the sealed sites after the laser sealing can be reduced. Further, the width of the frame part of the ceramic base can be narrowed, and an effective area of the hermetic package for functioning as a device can be enlarged.

A method of producing the hermetic package preferably comprises: a step of preparing a ceramic base comprising a base part and a frame part formed on the base part; a step of preparing a glass cover; a step of arranging the ceramic base and the glass cover so as to laminate the ceramic base and the glass cover on each other so that a top of the frame part of the ceramic base and the glass cover are brought into contact with each other via a sealing material layer; a step of radiating laser light from a glass cover side to allow the sealing material layer to soften and deform, to thereby hermetically integrate the ceramic base and the glass cover with each other to obtain a hermetic package.

In the step of arranging the ceramic base and the glass cover so as to laminate the ceramic base and the glass cover on each other, the glass cover may be arranged under the ceramic base, but from the viewpoint of efficiency of the laser sealing, is preferably arranged above the ceramic base.

In arranging the ceramic base and the glass cover so as to laminate the ceramic base and the glass cover on each other, it is preferred to arrange the sealing material layer and the ceramic base so as to bring the sealing material layer and the top of the frame part of the ceramic base into contact with each other so that the sealing material layer is positioned on a center line in a width direction of the top of the frame part of the ceramic base. With this configuration, the accuracy of the laser sealing can be improved.

Various lasers may be used as the laser to be radiated from the glass cover side. In particular, a semiconductor laser, a YAG laser, a $CO_2$ laser, an excimer laser, and an infrared laser are preferred because those lasers are easy to handle.

The beam shape of the laser light at the time of laser sealing is not particularly limited. A common beam shape includes a circle, an ellipse, and a rectangle, but any other shape may be adopted. In addition, the beam diameter of the laser light at the time of laser sealing is preferably from 0.3 mm to 3.5 mm.

An atmosphere for performing the laser sealing is not particularly limited. An air atmosphere or an inert atmosphere, such as a nitrogen atmosphere, may be adopted.

Before the laser sealing, the ceramic base is preferably preheated at a temperature equal to or higher than 100° C. and equal to or lower than the temperature limit of the internal device. With this configuration, thermal conduction toward a ceramic base side can be inhibited at the time of laser sealing, and hence the laser sealing can be performed efficiently.

The laser sealing is preferably performed under the state in which the glass cover is pressed. With this configuration, the softening and deformation of the sealing material layer can be promoted at the time of laser sealing.

The method of producing the hermetic package preferably further comprises a step of housing an internal device within the frame part of the ceramic base before arranging the ceramic base and the glass cover so as to laminate the ceramic base and the glass cover on each other. With this configuration, thermal degradation of the internal device can be suppressed.

EXAMPLES

Now, the present invention is described in detail by way of Examples. The following Examples are merely illustrative. The present invention is by no means limited to the following Examples.

Example 1

First, a glass ceramic base (measuring 15 mm in length by 15 mm in width, thickness of a base part: 0.5 mm, thickness of a frame part: 1.0 mm, thermal expansion coefficient: $60 \times 10^{-7}$/° C., light absorption rate at a wavelength of 808 nm when converted to 0.5 mm: 73%) comprising a base part and a frame part formed on the base part and comprising 3 mass % of a laser absorber was prepared. The "glass ceramic" is obtained by sintering a laminate sheet of green sheets each containing glass powder and refractory filler powder.

Next, a glass cover (measuring 15 mm in length by 15 mm in width by 0.3 mm in thickness, BDA manufactured by Nippon Electric Glass Co., Ltd.) formed of alkali borosilicate glass was prepared.

In addition, bismuth-based glass powder and refractory filler powder were mixed at a ratio of 68 vol %:32 vol % to produce a sealing material. In this case, the bismuth-based glass powder had an average particle diameter $D_{50}$ of 1.0 μm and a 99% particle diameter $D_{99}$ of 2.8 μm, and the refractory filler powder had an average particle diameter $D_{50}$ of 1.0 μm and a 99% particle diameter $D_{99}$ of 2.8 μm. The bismuth-based glass comprises as a glass composition, in terms of mol %, 39% of $Bi_2O_3$, 24.5% of $B_2O_3$, 14.5% of ZnO, 1.0% of $Al_2O_3$, 20.5% of CuO, and 0.5% of $Fe_2O_3$. In addition, the refractory filler powder is β-eucryptite.

The obtained sealing material was measured for a thermal expansion coefficient. As a result, it was found that the thermal expansion coefficient was $66 \times 10^{-7}$/° C. The thermal expansion coefficient is a value measured with a push-rod type TMA apparatus in a measurement temperature range of from 30° C. to 200° C.

Next, the sealing material was applied onto the glass cover along an outer peripheral edge portion of the glass cover, followed by drying, binder removal, and sintering. Thus, a sealing material layer was formed. Specifically, first, the above-mentioned sealing material, a vehicle, and a solvent were kneaded so as to achieve a viscosity within a range of 90±20 Pa·s (25° C., shear rate: 4), and then further kneaded with a triple roll mill until powders were homogeneously dispersed to be formed into a paste. Thus, a sealing material paste was obtained. A vehicle obtained by dissolving an ethyl cellulose organic resin in a glycol ether-based solvent was used as the vehicle. Next, the sealing material paste was printed in a frame shape on the outer peripheral edge portion of the glass cover with a screen printing machine. Further, the sealing material paste was dried at 120° C. for 10 minutes under an air atmosphere to obtain a dried film. After that, the dried film was subjected to binder removal and sintering through heat treatment using an electric furnace. Thus, a sealing material layer having an average width of about 300 μm and an average thickness of about 5 μm was formed. The light absorption rate of the sealing material layer at a wavelength of 808 nm when converted to 0.005 mm was 75%.

Finally, the glass cover on which the sealing material layer had been sintered and the glass ceramic base in which the laser absorber had been dispersed were laminated on each other, and laser light was radiated from a glass cover side to allow the sealing material layer to soften and flow, to thereby hermetically integrate the glass cover and the glass ceramic base with each other. Thus, a hermetic package was obtained. The output, scanning speed, and beam diameter of the laser are set to 10 W, 15 mm/sec, and φ500 μm, respectively.

Example 2

A hermetic package was obtained in the same manner as in Example 1 except that an alumina ceramic base (measuring 15 mm in length by 15 mm in width, thickness of a base part: 0.5 mm, thickness of a frame part: 1.0 mm, thermal expansion coefficient: $70 \times 10^{-7}$/° C., light absorption rate at a wavelength of 808 nm when converted to 0.5 mm: 75%) comprising a base part and a frame part formed on the base part and comprising 3 mass % of a laser absorber was used, and the output of the laser was set to 16 W.

Comparative Example 1

A hermetic package was obtained in the same manner as in Example 1 except that a glass ceramic base (measuring 15 mm in length by 15 mm in width, thickness of a base part: 0.5 mm, thickness of a frame part: 1.0 mm, thermal expansion coefficient: $58 \times 10^{-7}$/° C., light absorption rate at a wavelength of 808 nm when converted to 0.5 mm: 15%) comprising a base part and a frame part formed on the base part and being free of a laser absorber was used, and the output of the laser was set to 14 W.

Comparative Example 2

A hermetic package was obtained in the same manner as in Example 1 except that an alumina ceramic base (measuring 15 mm in length by 15 mm in width, thickness of a base part: 0.5 mm, thickness of a frame part: 1.0 mm, thermal expansion coefficient: $69 \times 10^{-7}$/° C., light absorption rate at a wavelength of 808 nm when converted to 0.5 mm: 34%) comprising a base part and a frame part formed on the base part and comprising 0.05% of a laser absorber was used, and the output of the laser was set to 19 W.

Evaluation

For each of the hermetic packages obtained in Examples 1 and 2 and Comparative Examples 1 and 2, the presence or absence of cracks was observed, and a temperature cycle test and a pressure cooker test were performed. The results are shown in Table 1.

TABLE 1

|  | Example 1 | Example 2 | Comparative Example 1 | Comparative Example 2 |
|---|---|---|---|---|
| Presence or absence of cracks | Absent | Absent | Present | Present |
| Temperature cycle test | o | o | x | x |
| Pressure cooker test | o | o | x | x |

The presence or absence of cracks was evaluated as follows: in the obtained hermetic package, the vicinity of the sealing material layer was observed with an optical microscope.

The temperature cycle test was evaluated as follows: the obtained hermetic package was repeatedly subjected to a temperature cycle under the conditions of 125° C.↔55° C. and 1,000 cycles, and then the vicinity of the sealing material layer was observed; and a case in which alternation, cracks, peeling, and the like were not observed was represented by Symbol "o", and a case in which alternation, cracks, peeling, and the like were observed was represented by Symbol "x".

The pressure cooker test (PCT) was evaluated as follows: the obtained hermetic package was retained under an environment at high temperature, high humidity, and high pressure under the conditions of 121° C., a humidity of 100%, 2 atm, and 24 hours, and then the vicinity of the sealing material layer was observed; and a case in which alternation, cracks, peeling, and the like were not observed was represented by Symbol "o", and a case in which alternation, cracks, peeling, and the like were observed was represented by Symbol "x".

As apparent from Table 1, the hermetic packages obtained in Examples 1 and 2 received satisfactory evaluation for the presence or absence of cracks, the temperature cycle test, and the pressure cooker test. Meanwhile, the hermetic packages obtained in Comparative Examples 1 and 2 received poor evaluation for the presence or absence of cracks, the temperature cycle test, and the pressure cooker test.

INDUSTRIAL APPLICABILITY

The hermetic package of the present invention is suitable as a hermetic package having mounted therein an internal device, such as a sensor chip or an LED. Other than the above, the hermetic package of the present invention is also suitably applicable to, for example, a hermetic package having housed therein, for example, a piezoelectric vibration device, or a wavelength conversion device in which quantum dots are dispersed in an organic resin.

REFERENCE SIGNS LIST 1 hermetic package
10 glass cover
11 ceramic base
12 base part
13 frame part
14 internal device
15 sealing material layer
16 top of frame part
17 laser irradiation apparatus
L laser light

The invention claimed is:

1. A hermetic package, comprising a ceramic base and a glass cover hermetically integrated with each other via a sealing material layer,
    wherein the ceramic base comprises 0.1 mass % to 10 mass % of a laser absorber, and
    wherein a difference between a light absorption rate of the ceramic base at a wavelength of 808 nm when converted to 0.5 mm and a light absorption rate of the sealing material layer at a wavelength of 808 nm when converted to 0.005 mm is 30% or less.
2. The hermetic package according to claim 1, wherein a total light reflectance of the ceramic base at a wavelength of 808 nm when converted to 0.5 mm is 60% or less.
3. The hermetic package according to claim 1, wherein the laser absorber in the ceramic base is formed of at least one selected from the group consisting of an Fe-based oxide, a Cr-based oxide, a Mn-based oxide, a Cu-based oxide, and spinel-type composite oxides thereof.
4. The hermetic package according to claim 1, wherein the ceramic base is formed of any one of glass ceramic, aluminum oxide, and aluminum nitride, or a composite material thereof.
5. The hermetic package according to claim 1,
    wherein the ceramic base comprises a base part and a frame part formed on the base part, and
    wherein the sealing material layer is provided between a top of the frame part and the glass cover.
6. The hermetic package according to claim 1, wherein the sealing material layer comprises bismuth-based glass containing a transition metal oxide in a glass composition and a refractory filler, and is substantially free of a laser absorber.
7. The hermetic package according to claim 1, wherein the ceramic base has an internal device housed within a frame part.
8. The hermetic package according to claim 2, wherein the laser absorber in the ceramic base is formed of at least one selected from the group consisting of an Fe-based oxide, a Cr-based oxide, a Mn-based oxide, a Cu-based oxide, and spinel-type composite oxides thereof.
9. The hermetic package according to claim 2, wherein the ceramic base is formed of any one of glass ceramic, aluminum oxide, and aluminum nitride, or a composite material thereof.
10. The hermetic package according to claim 3, wherein the ceramic base is formed of any one of glass ceramic, aluminum oxide, and aluminum nitride, or a composite material thereof.
11. The hermetic package according to claim 8, wherein the ceramic base is formed of any one of glass ceramic, aluminum oxide, and aluminum nitride, or a composite material thereof.
12. The hermetic package according to claim 2,
    wherein the ceramic base comprises a base part and a frame part formed on the base part, and
    wherein the sealing material layer is provided between a top of the frame part and the glass cover.
13. The hermetic package according to claim 3,
    wherein the ceramic base comprises a base part and a frame part formed on the base part, and
    wherein the sealing material layer is provided between a top of the frame part and the glass cover.
14. The hermetic package according to claim 4,
    wherein the ceramic base comprises a base part and a frame part formed on the base part, and
    wherein the sealing material layer is provided between a top of the frame part and the glass cover.
15. The hermetic package according to claim 8,
    wherein the ceramic base comprises a base part and a frame part formed on the base part, and
    wherein the sealing material layer is provided between a top of the frame part and the glass cover.
16. The hermetic package according to claim 9,
    wherein the ceramic base comprises a base part and a frame part formed on the base part, and
    wherein the sealing material layer is provided between a top of the frame part and the glass cover.
17. The hermetic package according to claim 10,
    wherein the ceramic base comprises a base part and a frame part formed on the base part, and
    wherein the sealing material layer is provided between a top of the frame part and the glass cover.
18. The hermetic package according to claim 11,
    wherein the ceramic base comprises a base part and a frame part formed on the base part, and
    wherein the sealing material layer is provided between a top of the frame part and the glass cover.
19. The hermetic package according to claim 2, wherein the sealing material layer comprises bismuth-based glass containing a transition metal oxide in a glass composition and a refractory filler, and is substantially free of a laser absorber.
20. The hermetic package according to claim 3, wherein the sealing material layer comprises bismuth-based glass containing a transition metal oxide in a glass composition and a refractory filler, and is substantially free of a laser absorber.

* * * * *